(12) United States Patent
Gudmunson et al.

(10) Patent No.: US 7,158,045 B1
(45) Date of Patent: Jan. 2, 2007

(54) METHOD AND APPARATUS FOR MAINTAINING AN IDEAL FREQUENCY RATIO BETWEEN NUMERICALLY-CONTROLLED FREQUENCY SOURCES

(75) Inventors: Daniel Gudmunson, Dripping Springs, TX (US); John Melanson, Austin, TX (US); Rahul Singh, Austin, TX (US); Ahsan Chowdhury, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 128 days.

(21) Appl. No.: 11/088,446

(22) Filed: Mar. 24, 2005

Related U.S. Application Data

(60) Provisional application No. 60/618,303, filed on Oct. 13, 2004.

(51) Int. Cl.
*H04L 7/00* (2006.01)
(52) U.S. Cl. ............ 340/825.21; 340/3.2; 340/536; 341/61; 375/356; 348/497
(58) Field of Classification Search ........ 340/536, 340/7.1, 3.2, 825.21; 341/61, 50, 51; 375/326, 375/341, 348, 259, 356; 713/400, 505; 370/545, 370/538, 216; 348/441, 497, 572, 536
See application file for complete search history.

(56) References Cited

U.S. PATENT DOCUMENTS

| | | | |
|---|---|---|---|
| 4,689,664 A | 8/1987 | Moring et al. | |
| 5,212,690 A * | 5/1993 | Low | 370/514 |
| 5,422,917 A * | 6/1995 | Scott | 375/371 |
| 5,739,762 A * | 4/1998 | Kuramatsu et al. | 340/825.21 |
| 6,028,900 A * | 2/2000 | Taura et al. | 375/344 |
| 6,148,051 A * | 11/2000 | Fujimori et al. | 375/356 |
| 6,208,671 B1 | 3/2001 | Paulos et al. | |
| 6,489,901 B1 | 12/2002 | Venkitachalam et al. | |
| 6,642,863 B1 | 11/2003 | Venkitachalam et al. | |

OTHER PUBLICATIONS

Vankka, et al., "A GSM/EDGE/WCDMA Modulator With On-Chip D/A Converter for Base Stations", IEEE Transactions on Circuits and Systems, vol. 49, No. 10, Oct. 2002.

* cited by examiner

*Primary Examiner*—Anh V. La
(74) *Attorney, Agent, or Firm*—Andrew M. Harris; Mitch Harris, Atty at Law, LLC

(57) ABSTRACT

A method and apparatus for maintaining an ideal frequency ratio between numerically-controlled frequency sources provides a mechanism for maintaining coherence between multiple synchronization references where a known ideal rational relationship between the sources is known. Multiple numerically controlled oscillators (NCOs) generate the multiple synchronization references, which may be clock signals or numeric phase representations and the outputs of the NCOs are compared with a ratiometric frequency comparator that determines whether there is an error in the ratio between the NCO outputs. The frequency of one of the NCOs is then adjusted with a frequency correction factor provided by the ratiometric frequency comparator. The NCO inputs can represent ratios of the synchronization reference frequencies to a fixed reference clock and the NCOs clocked by the fixed reference clock.

21 Claims, 5 Drawing Sheets

METHOD AND APPARATUS FOR MAINTAINING AN IDEAL FREQUENCY RATIO BETWEEN NUMERICALLY-CONTROLLED FREQUENCY SOURCES

CROSS-REFERENCE TO RELATED APPLICATIONS

This application is related to U.S. provisional application Ser. No. 60/618,303, filed Oct. 13, 2004 and from which it claims benefits under 35 U.S.C. §119(e).

The present application is also related to the following U.S. patent applications:

"INVERSE TRACKING OVER TWO DIFFERENT CLOCK DOMAINS" Ser. No. 10/964,556, filed Oct. 13, 2004; and "METHOD AND SYSTEM FOR SYNCHRONIZING VIDEO INFORMATION DERIVED FROM AN ASYNCHRONOUSLY SAMPLED VIDEO SIGNAL", Ser. No. 11/082,346, filed Mar. 13, 2005; and "METHOD AND SYSTEM FOR VIDEO-SYNCHRONOUS AUDIO CLOCK GENERATION FROM AN ASYNCHRONOUSLY SAMPLED VIDEO SIGNAL" Ser. No. 11/082,347, filed Mar. 13, 2005.

Each of the above-referenced patent applications has at least one inventor in common with the present application and are assigned to the same assignee. The specifications and drawings of each of the above-referenced patent applications are incorporated herein by reference.

BACKGROUND OF THE INVENTION

1. Field of the Invention

The present invention relates generally to audio/video (AV) systems, and more specifically, to a method and system for maintaining an ideal frequency ratio between numerically-controlled frequency sources.

2. Background of the Invention

Numerically controlled oscillators and other digital phase/frequency timebases are increasingly used in digital circuits that receive, generate and transform data to and from analog devices. In particular, the above-incorporated patent applications describe video and audio systems and circuits that sample input signals and transform them to the digital domain.

When two or more information streams are to be synchronized to numerically-generated timebases, the finite expression of the number controlling each timebase produces an error between an ideal relationship of the frequencies of the timebases and the actual frequencies of the timebases as controlled by the input numbers. In the above-incorporated patent applications, techniques are described for generating timebase information and/or synchronization signals from numbers representing ratios between a local precision reference oscillator frequency and a known or detected input information reference frequency and also from ratios between various desired output frequencies and the input information frequencies.

When two or more timebase or clock signal outputs are generated in such a scheme, for example in the audio/video synchronizing embodiment described in the above incorporated application entitled "METHOD AND SYSTEM FOR VIDEO-SYNCHRONOUS AUDIO CLOCK GENERATION FROM AN ASYNCHRONOUSLY SAMPLED VIDEO SIGNAL", long-term error between the generated audio clock or timebase and the generated video clock or timebase occurs due to the finite expression of the audio ratio and the video ratio numbers. There are two sources of finite expression error present in the described circuits: 1) The generated video synchronization reference is only as accurate as the video expression number will permit; and 2) The audio synchronization reference is not generated from the actual generated video synchronization reference and further is only as accurate as the audio ratio precision permits. Although these errors are small if the number of bits used to represent the ratios is sufficiently high, over long periods of time, synchronization drift will still occur between the sampled video and the sampled audio.

Therefore, it would be desirable to provide a method and system for maintaining an ideal ratio between numerically-controlled frequency sources so that long-term drift between the frequency sources can be eliminated.

SUMMARY OF THE INVENTION

The above stated objectives are achieved in a method and apparatus for maintaining a generated synchronization reference in an ideal ratiometric relationship with another generated synchronization reference.

A first synchronization reference is generated from a first ratio between a reference clock frequency and a first clock frequency and a second synchronization reference is generated from a second ratio between the reference clock frequency and a second clock frequency. A dynamic frequency correction factor is computed by comparing the frequency of the first synchronization reference to the frequency of the second synchronization reference via a rational frequency comparator. The dynamic frequency correction factor is applied to generation of the second synchronization reference to correct the frequency of the second synchronization reference so that an ideal rational relationship between the frequencies of the generated first and second synchronization references is maintained.

The dynamic frequency correction factor can be a dither factor that provides for preservation of the ideal ratio between the first and second references over a long-term average, or may provide a precision correction factor that stabilizes around a fixed value.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a method and apparatus for maintaining an ideal rational frequency relationship between two numerically generated synchronization sources, even though the numeric control values cannot express the ideal rational relationship. The method and apparatus adjust the frequency of a given one of the synchronization sources in conformity with a ratiometric frequency comparison of the outputs of the synchronization sources to the desired ideal ratio. The action of the method and apparatus compensate the frequency of the given synchronization source not only for error in the finite expression of the number controlling its frequency, but also for error in the other synchronization source frequency due to finite expression of the other frequency control number. The result is is that the present invention forces the long-term average frequency of the controlled synchronization source to be in ideal rational relationship with the actual frequency generated by the other synchronization source. Finite expression error is that error due to the finite number of bits used to express a binary number. In the present application, finite expression error is caused by error in a rational ratio between the frequencies two synchronization references that cannot be expressed in the number of bits employed to control the ratiometric synthesis of the synchronization source frequencies. Some ratios, e.g. 3/5, cannot be expressed completely in any number of bits. The "ideal ratio" as used herein, refers to the exact relationship desired between the synchronization sources, e.g., the actual audio to video synchronization frequency ratio embedded in a composite audio-video source.

The present invention is applicable any time that phase coherence and/or an exact frequency ratio needs to be maintained between two numerically-controlled frequency sources. However, the exemplary embodiments depicted herein are directed toward circuits and methods that produce a reference audio clock for sampling an audio signal. The reference audio clock is synchronized to a video source clock signal that has an ideal rational frequency relationship with the audio clock. The frequency of the reference audio clock is adjusted to maintain the ideal frequency ratio. However, the video clock could be adjusted for other applications by applying a frequency correction determined in accordance with an alternative embodiment of the present invention.

Figure 1:
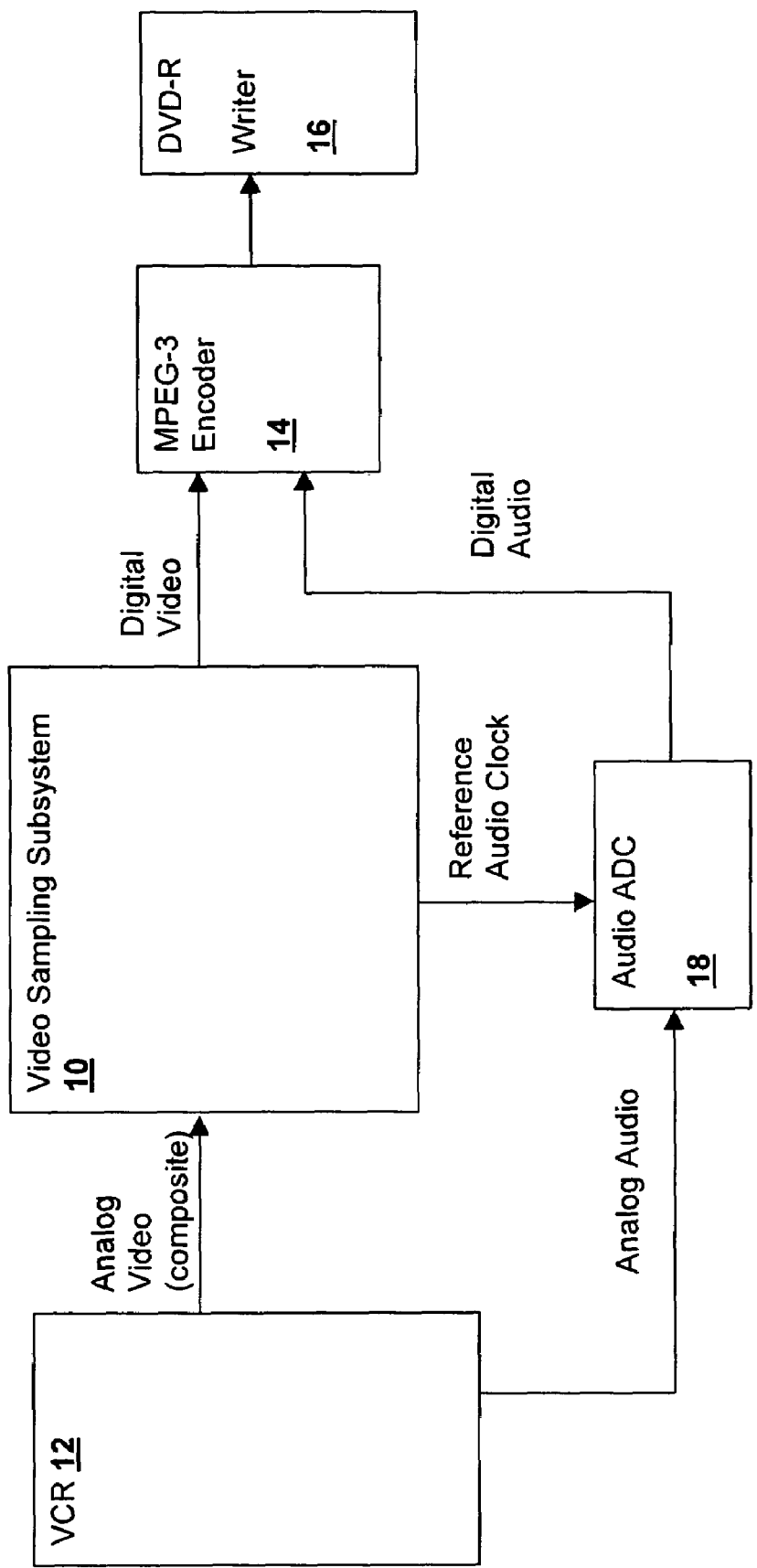
FIG. 1 is a block diagram depicting application of an apparatus in accordance with an embodiment of the present invention.

Referring now to FIG. 1, an application of a video sampling subsystem 10 including features in accordance with an embodiment of the invention is illustrated. The depicted application is video capture of a video cassette recorder (VCR) 12 output for storage on a digital versatile disc (DVD) via a DVD-R writer 16. Video processing subsystem 10 receives a composite video signal, such as an NTSC or PAL signal from VCR 12, and generates a reference audio clock that is provided to an audio analog-to-digital converter (ADC) 18 which receives the analog audio signals from VCR 12. ADC 18 should be understood to include anti-aliasing filters and data conversion elements to provide a proper digital audio output to MPEG-3 encoder 14, which may be wide parallel data, or a serial signal such as an S/P-DIF signal. Additionally, it should be understood that in place of VCR 12, another input device having a digital audio output that is synchronized to its video signal may be substituted and that the techniques of the present invention apply as well if audio ADC 18 is replaced with a digital audio receiver/sample rate converter.

MPEG-3 encoder 14 receives the sampled digital video produced by video sampling subsystem 10, which may be wide data or a serial digital interface such as DV-I. MPEG-3 encoder 14 bundles the received digital audio and video into an encoded and compressed file stream for storage by DVD-R writer 16.

Figure 2:
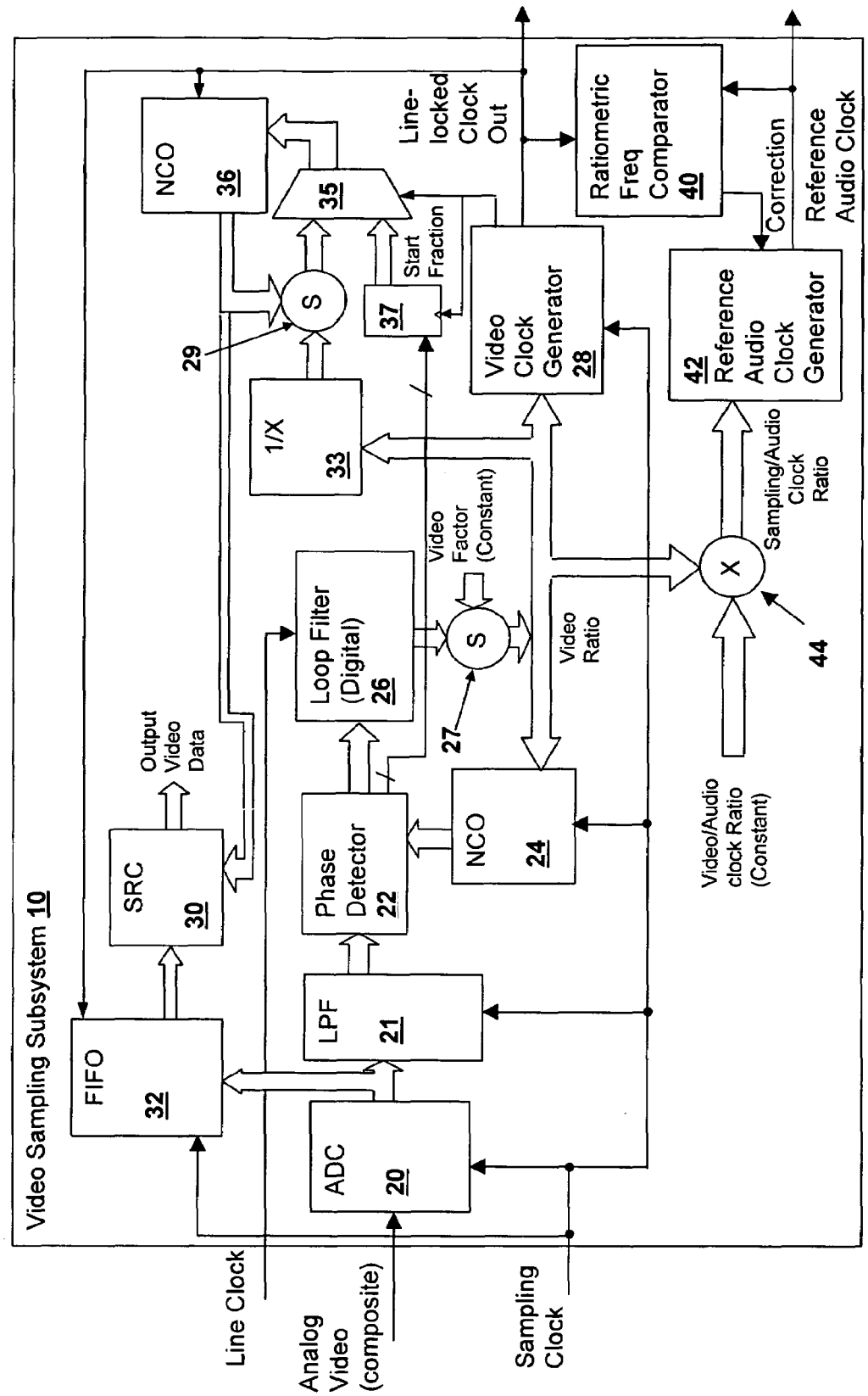
FIG. 2 is a block diagram of video sampling subsystem 10 of FIG. 1, including an apparatus in accordance with an embodiment of the present invention.

Referring now to FIG. 2, details of video sampling subsystem 10 of FIG. 1 are depicted. The analog video input signal is received and converted by an ADC 20 operating at the frequency of a provided sampling clock. The output of ADC 20 is digitally-filtered by low-pass filter (LPF) 21, which removes video and audio information, leaving only synchronization information, which can be at the line rate or the frame rate (or field rate). The filtered data is passed to a phase-detector 22 which compares the phase of the video synchronization data to the digital output of a numerically controlled oscillator (NCO) 24 and provides phase-correction error output to a loop filter 26 that closes the PLL by providing the control input to NCO 24 through an adder 27.

Adder 27 receives a number constituting a video factor that is added to the output of loop filter 26 to generate a frequency offset. The video factor is determined from the known difference between the video source frequency and the sampling frequency and may be adjusted programmatically to adapt to various video rates.

The output of adder 27 is a slowly-varying or essentially constant number corresponding to the ratio between the sampling clock rate and the video clock rate, labeled "video ratio". The video ratio is multiplied by a known factor (constant) representing the ratio of the video clock frequency to the desired reference audio clock frequency by a multiplier 44. The resulting "audio" ratio is the ratio between the sampling clock frequency and the desired reference audio clock rate and the audio ratio is supplied to a reference audio clock generator 42 that produces the reference audio clock. (The reference audio clock frequency will generally be a multiple of the actual audio data sample rate used by ADC 18.) A ratiometric frequency comparator 40 compares the frequencies of reference audio clock generator 42 and video clock generator 28 and adjusts the frequency of reference audio clock generator 42 to maintain a long-term average value of the ideal frequency ratio between the reference audio clock and the video line-locked clock. As the frequency difference is generally very small, it is not necessary to stabilize the reference audio clock frequency for some applications. In those applications, rational frequency comparator 40 may provide a dynamically changing frequency adjustment to dither the reference audio clock frequency around its ideal value with respect to the generated video line-locked clock. Alternatively, for applications requiring an extremely stable reference audio clock frequency, filtering may be employed and the dynamic frequency correction factor made to stabilize around a fixed frequency.

Loop filter 26 receives a line clock signal derived from other processing circuits that is synchronous with the video source line frequency. The line clock signal is used to synchronize the processing in the loop filter to avoid aliasing error that would occur through phase detector 22 due to the difference between the source video sync rate and the sync rate as sampled and appear as a "beat frequency" at the output of loop filter 26. Such beat frequencies can approach DC values and therefore are eliminated rather than filtered.

The video ratio is provided to an inverse function block 33 that generates a numeric output functionally inverse to the video ratio and therefore corresponding to a second ratio of the video source line rate to the sampling clock frequency.

The second (inverted) ratio provides an input to a second NCO 36 through multiplexer 35. NCO 36 generates a number (a) that controls a sample rate converter (SRC) 30 by adjusting coefficients of an interpolation filter. The second NCO 36 output is further supplied as feedback to an adder 29 that combines the inverse ratio from inverse function block 33 in combination with the output of NCO 36 to provide the input to NCO 36, when multiplexer 35 is in its normal operating state. The select input of multiplexer 35 is pulsed at the start of each line (or frame or field if the ratio is based on the frame or field) and causes a start fraction value to be loaded into NCO 36 at the beginning of each video sync interval. The start fraction is a value dependent on the sync rate of the incoming video and the desired output sync rate, which is obtained by latching a remainder value out of phase detector 22 via a latch 37. The feedback through adder 29 causes NCO 36 to generate a linearly varying progressive phase number a that is used by SRC 30 to interpolate digital video samples received from ADC 20 and stored in FIFO 32 to be synchronized with the new line rate.

While the above described circuits use a digital NCO 24 and a digital phase detector 22 that receives a waveform representation (generally parallel binary data that represents a ramp signal integrator output for phase-locking with the filtered input video sync data, which is also parallel digital data), other circuit embodiments, both digital and analog are contemplated by the present invention. In particular, NCO 24 may generate an actual signal waveform that is phase compared with either a digital or analog filtered sync signal and NCO may be replaced with a voltage-controlled oscillator (VCO) with an appropriate analog loop filter and analog adders/multipliers, or portions of the above-circuits may be implemented in analog circuits with appropriate A/D or D/A converters between disparate blocks. Also, a digital timebase input to phase detector 22 may be any digital representation of phase, which may be a parallel multi-bit number representing an absolute phase ramp (phase/time ramp) or other numeric indicator of the phase and frequency, such as numbers indicating an edge position and pulse width, etc.

Similarly, embodiments of the present invention may or may not generate an actual clock signal from the respective numerically-controlled oscillators (in the exemplary embodiment video clock generator 28 and reference audio clock generator 42), as long as the output of the respective numerically controlled oscillators can provide a phase and frequency reference. For example, in sample rate converter (SRC) applications where the audio input data is already in a digital format, the SRC input reference clock may be digital numeric data corresponding to a video-synchronized reference audio clock signal, but may require no actual reference audio clock signal to operate, as the converter may use the numeric audio reference clock data to operate interpolators and the SRC circuitry may be "clocked" by the sampling clock instead. Similarly, video clock generator 28 may not need to generate an actual clock waveform output, as rational frequency comparator 40 and other processing blocks may be designed to receive a numeric indication of phase.

Figures 3A, 3B:
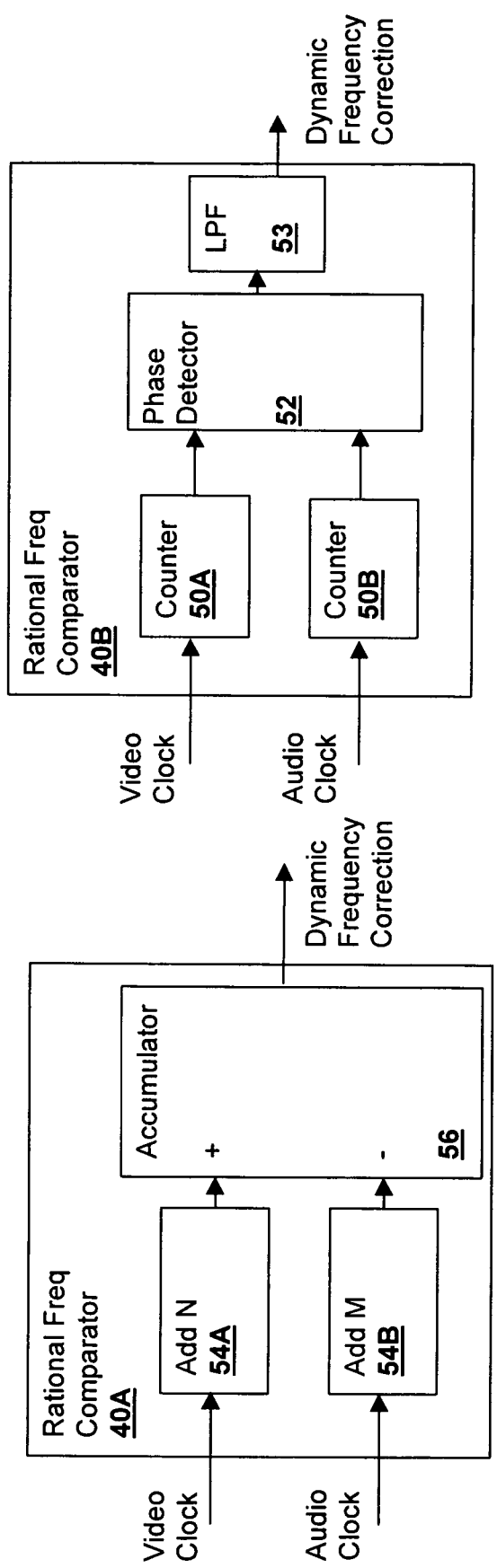
FIGS. 3A and 3B are block diagrams depicting exemplary implementations of ratiometric frequency comparator 40 of FIG. 2 in accordance with embodiments of the present invention.

Referring now to FIG. 3A, a rational frequency comparator 40A that may be employed as rational frequency comparator 40 of FIG. 2, is shown. Blocks 54A and 54B provide an additive value (or number of pulses) to an accumulator 56 which subtracts the audio clock counts from the video clock counts. The accumulator output provides the dynamic frequency correction factor to correct the frequency of the reference audio clock and may be a single bit representing the sign of the accumulated value for a coarse dither of the reference audio clock, or may be a magnitude value that is optionally filtered and effectively added to the audio ratio by the reference audio clock generator 42.

Referring now to FIG. 3B, another rational frequency comparator 40B that may be employed as rational frequency comparator 40 of FIG. 2, is shown. Counters 50A and 50B divide the video and audio clock signals by differing integers to provide scaling factors that scale down the outputs of counters 50A and 50B to be ideally equal in frequency (i.e., by the numerator and denominator of the ideal frequency ratio). A phase comparator 52 compares the phase of the scaled-down synchronization signals and the output of phase comparator 52 is optionally filtered by a low pass filter 53 to yield the dynamic frequency correction factor that is then provided to correct the frequency of the reference audio clock.

While FIGS. 3A and 3B provide exemplary embodiments of a ratiometric frequency comparator as are employed in circuits in accordance with embodiments of the present invention, it should be understood that there are alternative mechanisms for performing a ratiometric frequency comparison, and that any such comparator is contemplated for use in embodiments of the present invention.

Figure 4:
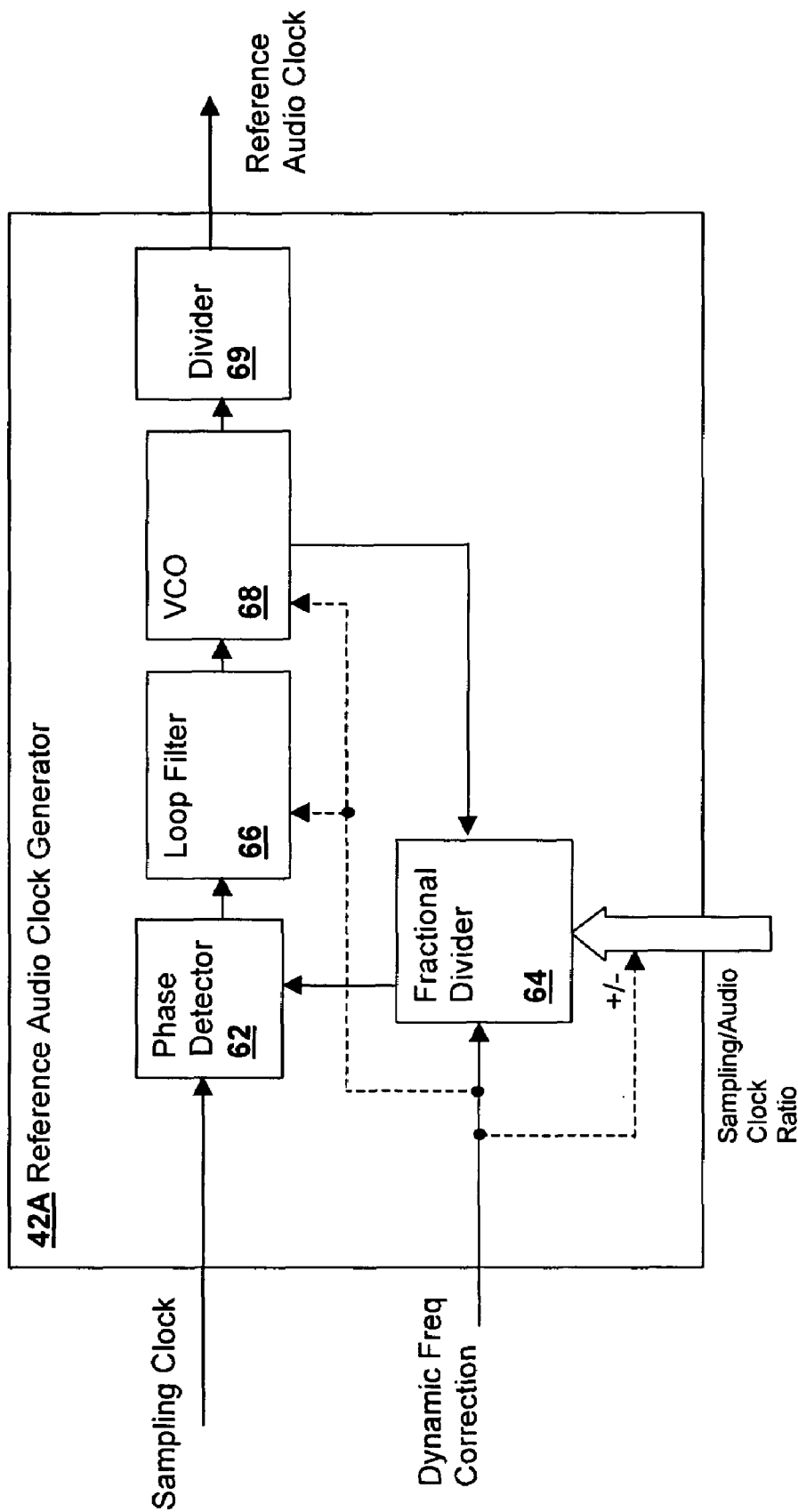
FIG. 4 is a block diagram depicting an exemplary implementation of reference audio clock generator 42 of FIG. 2 in accordance with an embodiment of the present invention.

Referring now to FIG. 4, details of a reference audio clock generator 29A that may be used to implement reference audio clock generator 29 of FIG. 2 is depicted in a block diagram. A fractional divider 64 receives the sampling clock/audio clock frequency ratio and divides the output of a voltage controlled oscillator (VCO) 68 to match phase and frequency with the sampling clock input which may be prescaled from the master sampling clock. Fractional divider 64 is a delta/sigma circuit that generates an average pulse signal corresponding to the input (VCO 68 output) value divided by the divisor (audio ratio) value.

A loop filter 66 provides the voltage control input to VCO 68 to close the loop, and a divider 69 reduces the output rate of VCO 68 to that of the desired reference audio clock frequency. The dynamic frequency correction factor, which may be a single bit, a multi-bit number or an analog signal is provided to reference audio clock generator 42 in order to adjust the long-term average of reference audio clock to be in ideal ratiometric relationship with the video line-locked clock. Generally the frequency correction factor will be supplied to fractional divider 64 or applied to the incoming ratio by an adder (illustrated as the +/− introduction of the dynamic frequency correction factor to the audio ratio input) to provide one or more additional bits of resolution to the ratio. However, as noted above, the correction does not have to be applied as a "fine adjustment" to the ratio, but may rather be a dithered "coarse" adjustment of frequency that maintains the long-term average frequency ratio at its ideal value.

The dashed lines connecting the dynamic frequency correction factor to various blocks within reference audio clock generator 42A illustrate various points at which a frequency control or dithered frequency shift could be introduced in the loop that controls VCO 68 and may include shifting the VCO 68 control voltage and adding or subtracting an offset within loop filter 66, in response to the detected deviation of the frequency ratio from the ideal. As explained above, any mechanism that permits dithering of the output frequency of VCO 68 around the ideal reference audio clock frequency value, as determined in ratio with the video line-locked clock, may be employed, as well as any mechanism that adjusts the frequency of VCO 68 to a stable ideal value.

Figure 5:
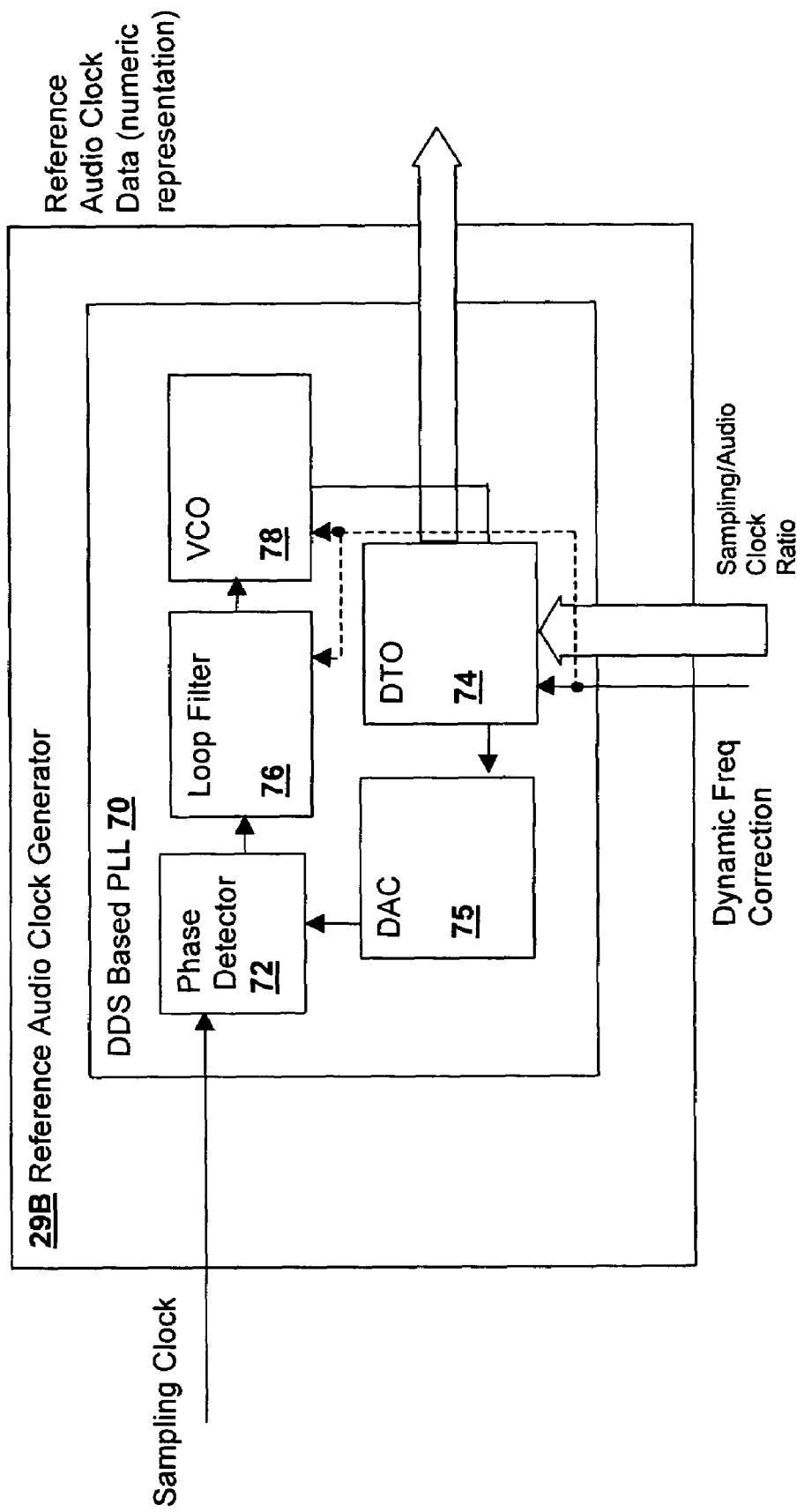
FIG. 5 is a block diagram depicting another exemplary implementation of reference audio clock generator 42 of FIG. 2 in accordance with an embodiment of the present invention.

Referring now to FIG. 5, another reference clock audio generator 29B that may be used to implement reference audio clock generator 29 of FIGS. 2 and 3 is shown. Reference audio clock generator 29B consists of a direct digital synthesis (DDS) based phase-lock loop (PLL) system 70 that generates the reference audio clock purely in the digital domain. The audio ratio is supplied to control a discrete time oscillator (DTO) that is clocked by VCO 78. The sampling reference clock is compared with the converted output of DTO 74 as provided via a digital-to-analog converter (DAC) 75, and the phase comparator output is smoothed by loop filter 76 to provide the control voltage input to VCO 78. As illustrated above with respect to the clock output oscillator of FIG. 4, various points of application of the dynamic frequency correction factor are illustrated via dashed lines, including the primary point of application directly to DTO 74, where one or more bits of correction can either be supplied as least-significant bits of the audio ratio (effectively by addition), or can be used to make coarse dither adjustments in DTO 74. Also as described with respect to FIG. 4, VCO 78 or loop filter 76 can be offset to supply dither or fine-tuning by the dynamic frequency correction.

Whether dithering, or adjustment via filtering or other means that provides a stable single frequency of the source being frequency controlled by the action of the present invention, the goal is that the long-term average of the frequency of the controlled frequency source is maintained in a prescribed "ideal" ratio to the other frequency source. While the exact period of averaging is particular to a specific application of the invention, in general with respect to audio and video sources, the average should be maintained so that no noticeable drift between the audio and the video content may be observed.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A method for maintaining phase coherence between two rationally related synchronization references, comprising:
    generating a first synchronization reference having a first output frequency determined by a first frequency control number;
    generating a second synchronization reference having a second output frequency determined by a second frequency control number and a dynamic frequency correction factor;
    ratiometrically comparing said first output frequency to said second output frequency to determine whether a ratio of said first output frequency to said second output frequency is above or below a predetermined frequency ratio between frequencies of said first and second synchronization references due to finite expression of said first and second frequency control numbers; and
    adjusting said dynamic frequency correction factor in conformity with a result of said comparing, whereby a long-term average of said second output frequency is maintained in said predetermined frequency ratio with said first output frequency.

2. The method of claim 1, wherein said first frequency control number represents a first ratio between a frequency of a reference clock and said first output frequency, wherein said second frequency control number represents a second ratio between said frequency of said reference clock and said second output frequency, and wherein said generating a first synchronization reference and said generating a second synchronization reference generate said first and second synchronization references from said reference clock and a corresponding one of said first and second ratios.

3. The method of claim 2, further comprising computing said second ratio from said first ratio.

4. The method of claim 1, wherein said generating a first synchronization reference generates a video synchronization reference and said generating a second synchronization reference generates an audio synchronization reference and wherein said adjusting maintains said audio synchronization reference in long-term phase coherence with said video synchronization reference.

5. The method of claim 1, wherein said generating a first synchronization reference generates a first numeric representation of a phase of said first synchronization reference and said generating a second synchronization reference generates a second numeric representation of a phase of said second synchronization reference.

6. The method of claim 1, wherein said generating a first synchronization reference generates a first signal providing said first synchronization reference and said generating a second synchronization reference generates a second signal providing said second synchronization reference.

7. The method of claim 1, wherein said comparing is performed by:
    adding a first number of counts to an accumulator for each cycle of said first output frequency; and
    subtracting a second number of counts to said accumulator for each cycle of said second output frequency, wherein a ratio of said first number to said second number is an inverse of said predetermined ratio, and wherein said adjusting computes said dynamic correction factor from a value of said accumulator.

8. The method of claim 1, wherein said comparing is performed by:
    dividing said first output frequency by a first factor;
    dividing said second output frequency by a second factor, wherein a ratio of said first factor to said second factor is equal to said predetermined ratio; and
    phase comparing a result of said dividing said first output frequency with a result of said dividing said second output frequency, and wherein said adjusting adjusts said dynamic correction factor in conformity with a result of said phase comparing.

9. The method of claim 1, wherein said dynamic frequency correction factor comprises at least two discrete values of frequency correction for adjusting said second output frequency above and below a predetermined value of said second output frequency, whereby said second output frequency is dithered by said adjusting to maintain said long-term average.

10. The method of claim 1, wherein said dynamic frequency correction factor comprises a continuous value for adjusting said second output frequency, whereby said second output frequency is maintained at a substantially stable value to maintain said long-term average.

11. A circuit for generating for generating two rationally related synchronization references, comprising:
    a first numerically controlled oscillator having a first output frequency determined by a first frequency control number;

a second numerically controlled oscillator having a second output frequency determined by a second frequency control number and a dynamic frequency correction factor;

a ratiometric frequency comparator having inputs for receiving an output of each of said first and second numerically controlled oscillators and an output providing said dynamic frequency correction factor, wherein said ratiometric frequency comparator ratiometrically compares said first output frequency to said second output frequency to determine whether a ratio of said first output frequency to said second output frequency is above or below a predetermined frequency ratio between frequencies of said first and second numerically controlled oscillators due to finite expression of said first and second frequency control numbers and adjusts said dynamic frequency correction factor in conformity with a result of said frequency comparison, whereby a long-term average of said second output frequency is maintained in said predetermined frequency ratio with said first output frequency.

12. The circuit of claim 11, wherein said first frequency control number represents a first ratio between a frequency of a reference clock and said first output frequency, wherein said second frequency control number represents a second ratio between said frequency of said reference clock and said second output frequency, and wherein said first and second numerically controlled oscillators generate said first and second output frequencies from said reference clock and a corresponding one of said first and second ratios.

13. The circuit of claim 12, further comprising a multiplier for multiplying said first ratio with a third ratio between said first output frequency and said second output frequency to compute said second ratio.

14. The circuit of claim 11, wherein said first numerically controlled oscillator generates a video synchronization reference and said second numerically controlled oscillator generates an audio synchronization reference and wherein said adjusting maintains said audio synchronization reference in long-term phase coherence with said video synchronization reference.

15. The circuit of claim 11, wherein said first numerically controlled oscillator generates a first numeric representation of a first synchronization reference and said second numerically controlled oscillator generates a second numeric representation of a second synchronization reference.

16. The circuit of claim 11, wherein said first numerically controlled oscillator generates a first signal providing a first synchronization reference and said second numerically controlled oscillator generates a second signal providing a second synchronization reference.

17. The circuit of claim 11, wherein said ratiometric frequency comparator comprises an accumulator that accumulates a first number of counts for each cycle of said first output frequency and subtracts a second number of counts for each cycle of said second output frequency, wherein a ratio of said first number to said second number is an inverse of said predetermined ratio, and wherein ratiometric frequency comparator computes said dynamic correction factor from a value of said accumulator.

18. The circuit of claim 11, wherein said ratiometric frequency comparator comprises:

a first divider for dividing said first output frequency by a first factor;

a second divider for dividing said second output frequency by a second factor, wherein a ratio of said first factor to said second factor is equal to said predetermined ratio; and a phase comparator for comparing an output of said first divider with an output of said second divider, and wherein said phase comparator adjusts said dynamic correction factor in conformity with a result of said phase comparing.

19. The circuit of claim 11, wherein said dynamic frequency correction factor has at least two discrete states for adjusting said second output frequency above and below a predetermined value of said second output frequency, whereby said second output frequency is dithered by said toggling said dynamic frequency correction between said at least two states to maintain said long-term average.

20. The circuit of claim 11, wherein said dynamic frequency correction factor comprises a continuous value for adjusting said second output frequency, whereby said second output frequency is maintained at a substantially stable value to maintain said long-term average.

21. A circuit for generating for generating two rationally related synchronization references, comprising:

a synchronization reference generator having an output frequency controlled by a number;

another synchronization reference generator having another output frequency controlled by another number;

means for computing a deviation between a ratio of said output frequency to said another output frequency to a predetermined value of said ratio; and means for adjusting said another output frequency responsive to said computing means.

* * * * *